United States Patent [19]
Takita et al.

[11] 3,982,191
[45] Sept. 21, 1976

[54] CHARGE STORAGE TUBE AND METHOD FOR OPERATING THE SAME

[75] Inventors: Hajime Takita; Takehumi Katow, both of Tokyo, Japan

[73] Assignee: Iwatsu Electric Co., Ltd., Tokyo, Japan

[22] Filed: Feb. 7, 1975

[21] Appl. No.: 547,964

[30] Foreign Application Priority Data
Feb. 9, 1974 Japan............................ 49-016576

[52] U.S. Cl............................... 328/124; 313/392; 313/393
[51] Int. Cl.² ................. G11C 11/34; G11C 11/26
[58] Field of Search ........... 328/123, 124; 313/392, 313/393

[56] References Cited
UNITED STATES PATENTS

| | | |
|---|---|---|
| 3,003,110 | 10/1961 | Toulemonde........................ 328/124 |
| 3,528,064 | 9/1970 | Everhart et al. ................ 328/123 X |
| 3,675,134 | 7/1972 | Luedicke et al..................... 328/124 |
| 3,748,585 | 7/1973 | Culter et al......................... 328/124 |

*Primary Examiner*—John S. Heyman
*Attorney, Agent, or Firm*—McDougall, Hersh & Scott

[57] ABSTRACT

A charge storage tube includes a target comprising a semiconductor substrate, an insulating layer formed on the semiconductor substrate and a metal electrode formed on the insulating layer, wherein a target potential of the target can be changed so that it becomes not only below a first cross-over potential but also over the first cross-over potential. In the charge storage tube, a signal is written in the target by a signal writing means to generate pairs of electron-hole in the target, a surface potential of the insulating layer with the written signal is changed so as to become over the first cross-over potential, and the written signal is read out by scanning electron beams on the target.

11 Claims, 12 Drawing Figures

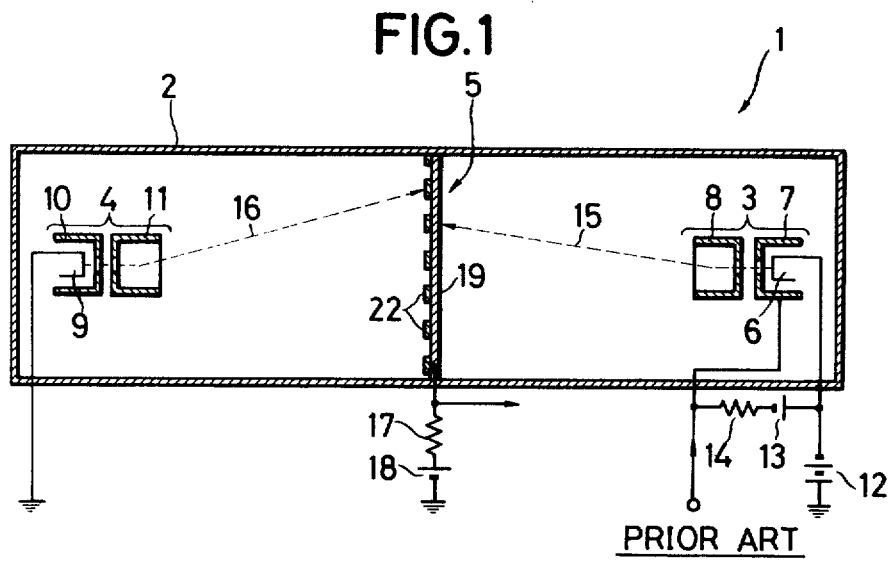
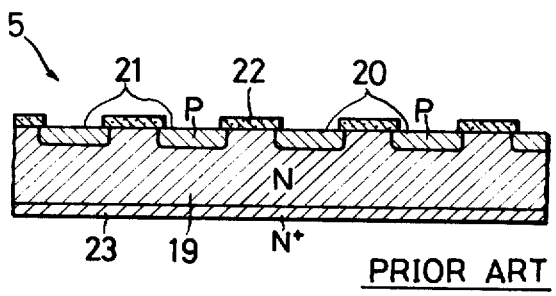
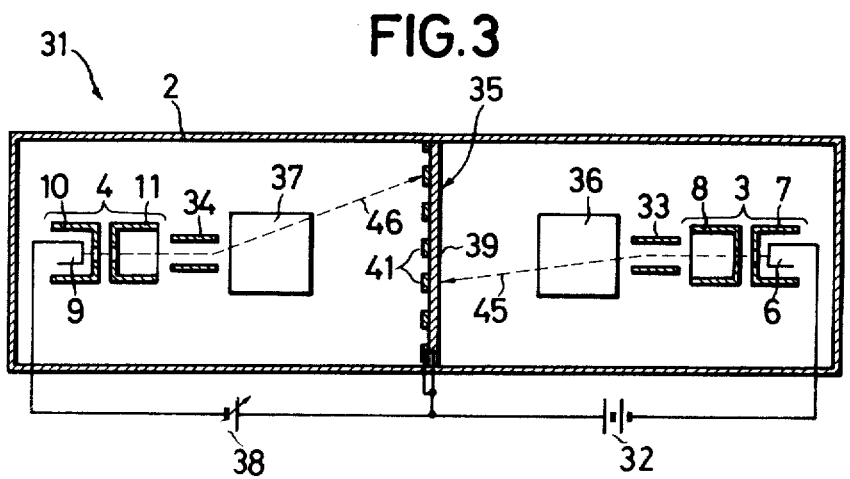

CHARGE STORAGE TUBE AND METHOD FOR OPERATING THE SAME

BACKGROUND OF THE INVENTION

1. Field of the Invention

This invention relates to a charge storage tube and a method for operating the same, most suitable for a signal conversion type or an image pickup type charge storage tube wherein an electric signal or a photo signal is storaged and the storaged signal is read out as an electric signal.

2. Description of the Prior Art

The conventional charge storage tube 1 as shown on FIG. 1 includes a vacuum tube 2 made of glass, in which an electron gun 3 for writing a signal and an electron gun 4 for reading the signal are opposite to each other, and a target 5 is arranged between the electron guns 3 and 4. The electron gun 3 comprises a cathode 6, a control electrode 7 and an accelerating anode 8. The electron gun 4 also comprises a cathode 9, a control electrode 10 and an accelerating electrode 11. The cathode 6 is earthed through a power source 12 in common with the cathode 9 and connected to the electrode 7 through a power source 13 and a resistance 14. In the tube 2, focusing and deflecting electrodes (not shown) are disposed in order to scan electron beams 15 and 16 from the electron guns 3 and 4 on the given positions of the target 5 respectively. The target 5 is earthed through a resistance 17 and a power source 18. As shown on FIG. 2, the target 5 comprises an N-type semiconductor substrate 19 and an insulating layer 22 such as a $SiO_2$ layer having openings 21. P-type semiconductive regions 20 are formed on the surface of the semiconductor substrate 19 at a regular interval by diffusing impurities through the openings 21 into the semiconductor substrate 19. An $N^+$-type semiconductive region 23 is formed on the back surface of the semiconductor substrate 19, whereby pairs of electron-hole below mentioned are prevented from recombining.

Next, the operation of the charge storage tube 1 will be described.

First, the electron beam 16 from the cathode 9 is scanned uniformly on the surface of the target 5, whereby the potential of the surface of the P-type semiconductive regions 20 existing in the openings 21 become equal to that of the cathode 9. In this case, each PN junction diode formed by the P-type semiconductor regions 20 and the semiconductor substrate 19 is reversely biased or electrically charged by the formation of depletion layer, since a plus potential of about 10 V is supplied to the semiconductor substrate 19 from the power source 18. And then a signal voltage is supplied to the electrode 7 of the electron gun 3 to generate the electron beam 15, which attacks the given positions of the semiconductor substrate 19 when the potential of about −2 KV is given to the cathode 6 by the power source 12. Consequently, pairs of electron-hole are generated in the semiconductor substrate 19 by signal writing beams with an accelerating energy and a signal corresponding to the potential of the cathode 6. The pairs of electron-hole diffuse in non-electric field region within the semiconductor substrate 19. The holes drift in the depletion layer of the above-mentioned diode to neutralize negative charges stored in the P-type semiconductive region 20, whereby the charges are electrically discharged. As a result of the discharge of electricity, the surface potential of the P-type semiconductive regions 20 become higher and an image corresponding to the above-mentioned signal is formed on the diode so that the writing operation ends. Next, at this condition, the electron beams from the electron gun 4 are scanned uniformly against the target 5 in order to charge the discharged diodes electrically again. The charging currents are taken out as output signal whereby the reading operation ends.

According to the charge storage tube 1, however, a written signal is erased by the reading operation since the writing operation and the reading operation are done by the charge and the discharge of the PN junction diode as described above. Accordingly, the written signal is read out, as it were, by destroying it and therefore it is impossible to retain the written condition. Moreover, the written condition can not be retained even for more than one second due to dark currents or reverse currents passing through the PN junction, whereby the written signal disappears without doing the reading operation.

SUMMARY OF THE INVENTION

One object of this invention is to provide a charge storage tube and a method for operating the same, in which a written signal is not eliminated by a reading operation.

Another object of this invention is to provide a charge storage tube and a method for operating the same, in which a writing operation can be done at a high speed.

A still another object of this invention is to provide a charge storage tube and a method for operating the same, in which a written condition can be retained for a long time by preventing dark currents.

In accordance with an aspect of this invention, a charge storage tube comprises a target, means for writing a signal in the target by generating pairs of electron-hole in the target, and means for reading out the signal by scanning electron beams on the target, wherein the target comprises a semiconductor substrate and an insulating layer formed on the semiconductor substrate on which a metal electrode having openings is formed, and a target potential of the target can be changed so that it becomes not only below a first cross-over potential of an accelerating potential of the electron beams, but also over the first cross-over potential. In accordance with another aspect of this invention, a method for operating the charge storage tube includes the steps of writing a signal in the target at the target potential over the first cross-over potential, raising a surface potential of the insulating layer with the written signal over the cross-over potential, and reading out the written signal by scanning electron beams on the target.

The above, and other objects, features and advantages of the invention, will be apparent in the following detailed description of illustrative embodiments thereof which is to be read in connection with the accompanying drawings.

BRIEF DESCRIPTION OF THE DRAWINGS

FIG. 1 is a cross-sectional view of the conventional charge storage tube of signal conversion type;

FIG. 2 is a partial cross-sectional view of a target employed in the conventional charge storage tube shown on FIG. 1;

FIG. 3 is a cross-sectional view of a charge storage tube of signal conversion type according to one embodiment of this invention;

DESCRIPTION OF THE PREFERRED EMBODIMENTS

Figure 4:
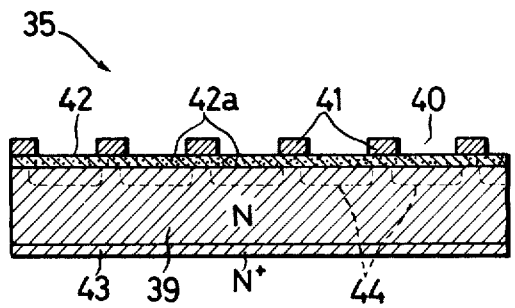
FIG. 4 is a partial cross-sectional view of a target employed in the charge storage tube shown on FIG. 3.

The first embodiment of this invention will be described below with reference to FIGS. 3–7.

A charge storage tube 31 shown on FIG. 3 has the same construction as that of the charge storage tube 1 shown on FIG. 1 except a distribution between each part and a target. Accordingly, the same parts as those shown on FIG. 1 are not explained in detail by marking the same reference numerals. A target 35 is arranged between the electron guns 3 and 4 in the vacuum tube 2 of the charge storage tube 31. The cathodes 6 and 9 of the electron guns 3 and 4 are connected to each other through a power source 32 and a variable power source 38. The variable power source 38 is connected between the cathode 9 and the target 35. A Y-deflecting electrode 34 and an X-deflecting electrode 37 to focus and deflect an electron beam 46 electrostatically are arranged between the electron gun 4 and the target 35. A Y-deflecting electrode 33 and an X-deflecting electrode 36 to focus and deflect an electron beam 45 electrostatically are arranged between the electron gun 3 and the target 35. Though focusing and deflecting coils can be arranged outside of the vacuum tube 2 so as to focus and deflect the electron beams 45 and 46 electro-magnetically, the deflection velocity by the above-mentioned deflecting electrodes is larger than that by the deflecting coils.

The target 35 has a construction shown on FIG. 4, wherein an N-type semiconductor substrate 39 formed of silicon has a thickness of 100 $\mu$m or more and a specific resistance above 1 $\Omega$cm, for example, of about 10 $\Omega$cm, and an insulating layer 42 formed of $SiO_2$ with a thickness of 200 A – 1 $\mu$m, for example, about 1000 A is formed on the surface of the semiconductor substrate 39 by thermo oxidation method. A mesh-like metal electrode 41 made of Al is formed on the surface of the insulating layer 42. The metal electrode 41 may be made of another metal such as Cr, Mo or Au. The electrode 41 has rectangular openings 40 with a regular pitch of 5–30 $\mu$m, for example, about 20 $\mu$m. In the formation of the electrode 41, a metal such as Al is deposited on the whole surface of the insulating layer 42 by evaporation, spattering or the like, and thereafter the given portions of the metal are selectively removed by the known photo etching method, so that the openings 40 are formed. An $N^+$-type semiconductive region 43 is formed on the back surface of the semiconductor substrate 39 in order to prevent the recombination of pairs of electron-hole generating on the belowmentioned signal writing operation.

Next, the operation of the charge storage tube 31 will be described. An electron beam 46 from the electron gun 4 is scanned uniformly on the surface of the target 35 in such a situation that the potential of the cathode 9 of the electron gun 4 is equal to earth potential. In this case, by the power source 38, the potential of the electrode 41 or the semiconductor substrate 39, which is described as "target potential" hereafter, is set up against the cathode 6 of the electron gun 3, for example, at about 15 V below the first cross-over potential or the accelerating potential at which the secondary-emission ratio of the insulating layer 42 becomes 1 again next to the accelerating potential = 0. Consequently, the potential of the surface 42a of the insulating layer 42 becomes equal to the potential of the cathode 9 or earth potential while the potential of the semiconductor substrate 39 is maintained at about 15V by the power source 38. As a result, the semiconductive regions of the semiconductor substrate 39 below the openings 40 are reversely biased to form depletion layers 44 therein, whereby the preparatory operation for writing a signal ends. In this situation, hetero junction diodes, which are described as "I-S diodes" hereafter, corresponding to each opening 40 are formed by the insulating layer 42 and the semiconductor substrate 39.

Figure 5:
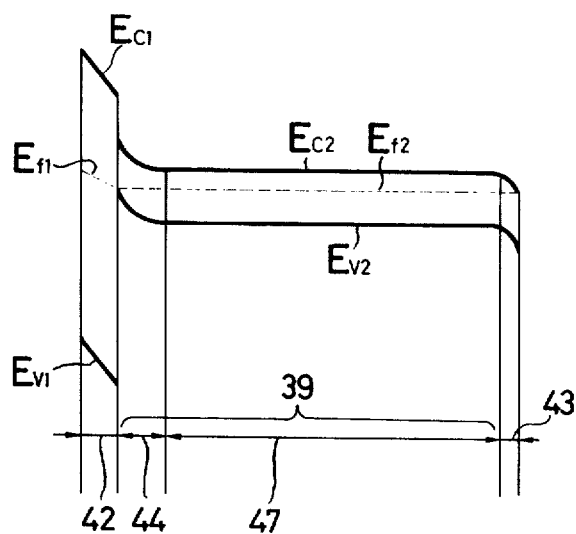
FIG. 5 is an energy band view of the reversely biased target shown on FIG. 4.

According to an energy band shown on FIG. 5, the insulating layer 42 has a conduction band $E_{c1}$, a full band $E_{v1}$ and a Fermi level $E_{f1}$ respectively, and a conduction band $E_{c2}$, a full band $E_{v2}$ and a Fermi level $E_{f2}$ are formed extending over the depletion layer 44, a non-electric field region 47 and the $N^+$-type semiconductive region 43. The I-S diodes have a series capacitance C formed by connecting a capacitance $C_1$ of the insulating layer 42 with a capacitance $C_D$ of the depletion layer 44 in series.

After the preparatory operation for writing the signal described above, the signal is written in the target 35 by the electron gun 3. In this case, a signal writing velocity generally becomes larger if an accelerating energy of the electron beam 4 for writing becomes larger. The potential of the cathode 6 is set up at minus several hundred volts to minus several tens KV, for example, about −5 KV. The electron beam 45 attacks the semiconductor substrate 39 from the side of the $N^+$-type semiconductive region 43 at the energy of about 5 KeV. As a result, about 1400 pairs of electron-hole are generated in the semiconductor substrate 39, which diffuse through the non-electric field region 47 of the semiconductor substrate 39. In this case, some pairs of electron-hole are eliminated by their recombination and the remaining pairs of electron-hole drift through the depletion layer 44 to be stored up in the interface between the insulating layer 42 and the semiconductor substrate 39, whereby the capacitance $C_D$ of the depletion layer 44 is electrically discharged. Consequently, the potential of the surface 42a of the insulating layer 42 existing in the opening 40 rises up from the earth potential to about 10 V, which depends on the ratio of the capacitance $C_1$ of the insulating layer 42 to the capacitance $C_D$ of the depletion layer 44.

Figure 6:
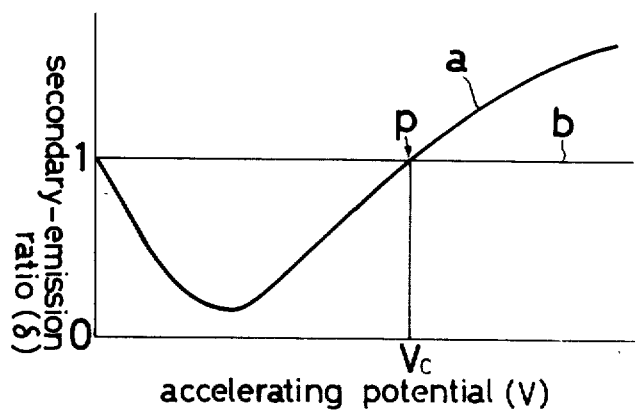
FIG. 6 is a graph showing a secondary-emission characteristics.

A secondary-emission characteristic of the insulating layer 42 is shown on FIG. 6 wherein a curve a shows a change of a secondary-emission ratio and a straight line b shows the secondary-emission ratio = 1. An electron beam accelerating potential $V_c$ = about 30 V corresponding to an intersecting point $p$ of the curves a and b is a first cross-over potential.

Next, a preparatory operation for reading the signal after the above-mentioned writing operation will be described. The target potential is changed by the variable power source 38 against the potential of the cathode 6 so that the target potential (= about 15 V) is shifted to a potential, for example, about 40 V over the above-mentioned first cross-over potential (= about 30 V). As a result, the potential of the surface 42a of the insulating layer 42 on which the signal has been written is raised from about 10 V to about 35 V, while the potential of the surface 42a of the insulating layer 42 on which no signal has been written becomes about 25 V. In this condition the electron beam 46 from the electron gun 4 is scanned uniformly on the target 35, whereby the potential of the surface 42a over the first cross-over potential becomes equal to the potential of the metal electrode 41 and the potential of the surface 42a below the cross-over potential becomes equal to the potential of the cathode 9.

Next, a reading operation is done in this condition. The target potential is set up at the potential, for example, about 15 V below the first cross-over potential against the cathode 9. As a result, the potential of the surface 42a on which the signal has been written becomes about 15 V, while the potential of the surface 42a on which no signal has been written becomes about 25 V. The electron beam 46 is then scanned uniformly on the target 35, whereby the potential of the former surface 42a becomes substantially equal to that of the cathode 9 and the potential of the latter surface 42a is maintained at about −25 V because the electron beam 46 is repelled and does not land thereon. Consequently, the electron beam 46 can not land on the metal electrode 41 contiguous to the I-S diode without the written signal due to a grid effect, however, the electron beam 46 can land on the metal electrode 41 contiguous to the I-S diode with the written signal so that beam currents due to the landing electron beam 46 flow through the metal electrode 41. Namely, the beam currents of the electron beam 46 modulated by the grid effect of the target 35 are taken out as output signals, whereby the reading operation ends.

In an erasing operation of the written signal, the electron beam 46 is scanned uniformly on the target 35 in such a situation that the target potential is set up at the potential, for example, about 80V over the first cross-over potential against the cathode 9. As a result, the potential of the surface 42a on which no signal has been written becomes about 40V and the secondary-emission ratio becomes over 1, whereby the potential of the surface 42a of the insulating layer 42 becomes uniformly equal to the potential of the metal electrode 41.

Next, the electron beam 46 is scanned again on the target in such a situation that the potential of the metal electrode 41 is set up at about 15V, whereby the above-mentioned preparatory operation for writing a signal can be reappeared.

Figures 7A, 7B:
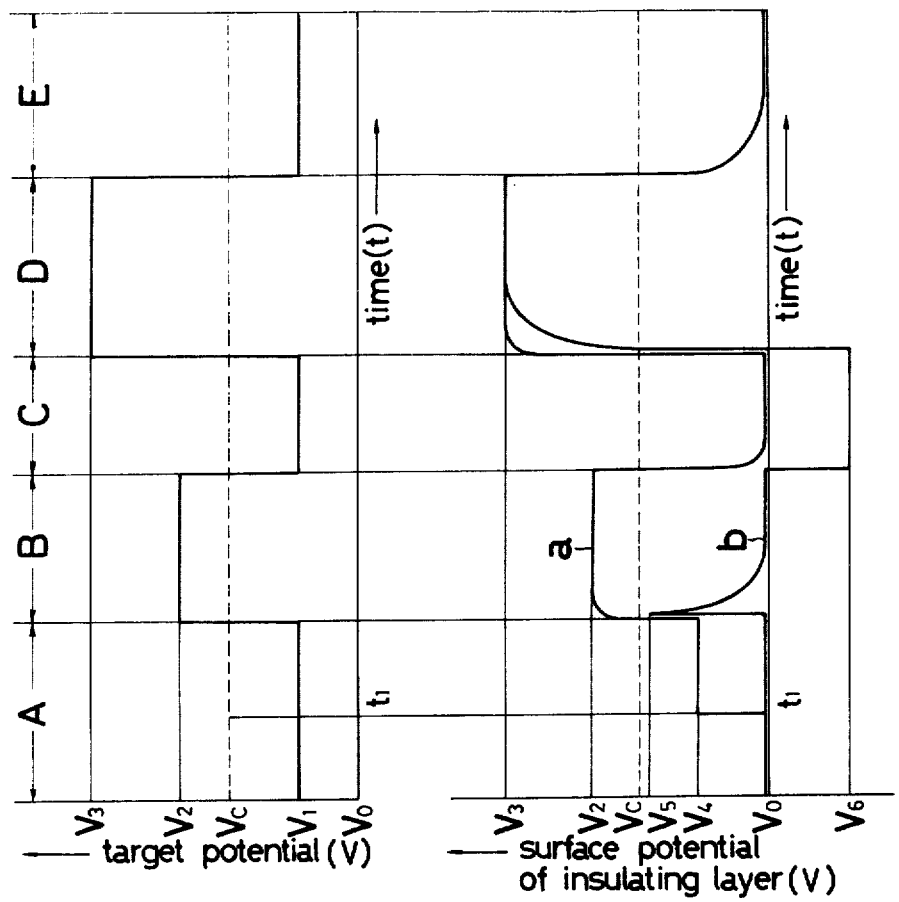
FIG. 7A is a graph showing a change of the target potential at each operation.
FIG. 7B is a graph showing a change of a surface potential of an insulating layer of the target shown on FIG. 4 at each operation.

In FIG. 7A, there are shown the target potentials at the preparatory operation for writing, the writing operation, the preparatory operation for reading, the reading operation and the erasing operation on the basis of the potential $V_o$ of the cathode 9. The axis of ordinate shows the target potential V and the axis of abscissa shows the time $t$ required for the above-mentioned each operation corresponding to sections A, B, C, D and E respectively. Namely, the section A corresponds to the preparatory operation for writing and the writing operation, the section B corresponds to the preparatory operation for reading, the section C corresponds to the reading operation, the section D corresponds to the erasing operation and the section E corresponds to the preparatory operation for writing. In FIG. 7B, curves $a$ and $b$ show the changes of the surface potential of the insulating layer with and without the written signal on the basis of the potential $V_o$ of the cathode 9 respectively. Moreover, the dotted lines shown on FIGS. 7A and 7B represent the first cross-over potential $V_c$.

The target potential $V_1$ of the sections A and B is preferably about 3–20 V (about 15 V in the embodiment) and the target potential $V_2$ of the section B must be set up over the first cross-over potential $V_c$ (at about 40 V in this embodiments). The target potential $V_3$ is set up over the first cross-over potential $V_c$ (at about 80 V in this embodiment).

After a signal is written at the time $t_1$, as shown on FIG. 7B, the surface potential V of the insulating layer with the written signal rises up from the cathode potential $V_o$ to the cathode potential $V_4$ (about 10 V in this embodiment) and the surface potential V then becomes equal to the target potential $V_2$ by the preparatory operation for reading. Though the surface potential of the insulating layer without the written signal rises up to some extent at the beginning of the preparatory operation for reading, the surface potential $V_5$ at this time (about 25 V in this embodiment) is below the first cross-over potential $V_c$. Therefore, the surface potential $V_5$ is reduced to the cathode potential $V_o$ by the scanning of electron beams. The surface potential of the insulating layer without the written signal is reduced to the surface potential $V_6$ (about −25 V in this embodiment) by the reading operation corresponding to the section C. The surface potentials of the insulating layer with and without the written signal wholly become the target potential $V_3$ over the first cross-over potential $V_c$ by the erasing operation corresponding to the section D.

In this embodiment, as described above, the target potential is set up over the first cross-over potential at the preparatory operation for reading before the reading operation for the target including a plurality of I-S diodes, whereby the surface potentials of the insulating layer with and without the written signal become over and below the first cross-over potential respectively. Consequently, the written or stored signal is not erased at the scanning of the reading electron beam to maintain the written signal. Pairs of electron-hole with the numbers in proportion to bombarding energy of writing electron beams are generated in the semiconductor substrate in which the depletion layer and the non-electric field region are formed, whereby the pairs of electron-hole number up to about 1500 when the accelerating energy of the writing electron beams is 5 KeV due to a doubling effect. Electrons from the pairs of electron-hole reach the intersecting surface of Si-SiO$_2$ by diffusion and drift to electrically discharge the I-S diodes. Accordingly, the high doubling effect can be gained to write the signal rapidly or to catch a rapid change of the signal or phenomenon to be written. A mesh-like element to store the signal has been used for a storage oscilloscope or the like, wherein only the signal with several tens MHz can be catched. On the other hand, the signal with several GHz can be catched according to this embodiment.

Moreover, the surface potential of the insulating layer on which the signal has been written is maintained over the first cross-over potential when the I-S diodes are reversely biased, whereby dark currents are effectively prevented from flowing through the I-S diodes to keep the written signal for a long time.

Next, the second embodiment of this invention will be described with reference to FIGS. 8 and 9.

Figure 8:
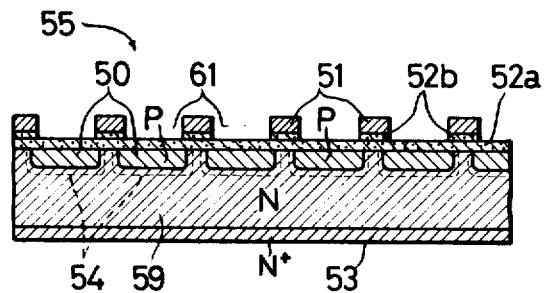
FIG. 8 is a partial cross-sectional view of a target of a charge storage tube of signal conversion type according to another embodiment of this invention.
Figure 9A:
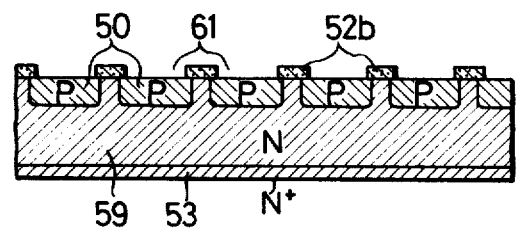
FIGS. 9A-9C are cross-sectional views of the target shown on FIG. 8 at its manufacturing process.

In this embodiment, a target 55 shown on FIG. 8 is used, wherein island-like P-type semiconductive regions 50 are formed in an N-type semiconductor substrate 59 made of silicon at a regular interval. An insulating layer 52a made of $SiO_2$ is formed on the whole surface of the semiconductor substrate 59. The insulating layer 52a may be made of another insulating material such as $Al_2O_3$ or $CaF_2$. A mesh-like insulating layer 52b made of $SiO_2$ with openings 61 corresponding to the P-type semiconductive regions 50 is formed on the insulating layer 52a. The insulating layer 52b may also be made of another insulating material such as $Al_2O_3$ or $CaF_2$. A mesh-like metal electrode 51 made of Al is formed on the insulating layer 52b. The semiconductor substrate 59 has an $N^+$-type semiconductive region 53 on its back side.

Each operation from a preparatory operation for writing a signal to an erasing operation can be done in such a manner that the above-mentioned first embodiment is done.

In this embodiment, particularly, depletion layers 54 are formed between the P-type semiconductive regions 50 and the semiconductor substrate 59 by the preparatory operation for writing a signal. The capacitance of the depletion layer 54 is larger than that of the depletion layer 44 shown on FIG. 4 and therefore the writing velocity becomes larger.

The process to manufacture the target 55 will be now described. First, as shown on FIG. 9A, the insulating layer 52b is formed on the semiconductor substrate 59 by the known photo etching method. In this case, the $N^+$-type semiconductive region 53 is previously formed on the back side of the semiconductor substrate 59. The insulating layer 52b has openings 61 corresponding to the P-type semiconductive regions 50.

Next, an impurity such as boron is diffused into the semiconductor substrate 59 through the openings 61 to form the P-type semiconductive regions 59 at a regular interval.

Figure 9B:
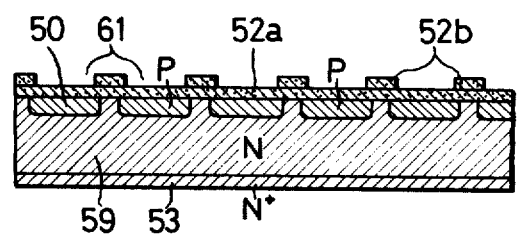
Figure 9C:
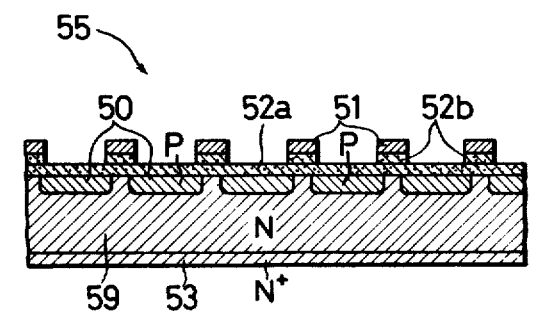

Next, as shown on FIG. 9B, the surface of the semiconductor substrate 59 is thermally oxidized to form the insulating layer 52a of $SiO_2$ uniformly. The insulating layer 52a may be formed by spattering $SiO_2$, $Al_2O_3$ or $CaF_2$ on the surface of the semiconductor substrate 59. A metal such as Al is then deposited on the surface of the insulating layer 52b to form the metal electrode 51, whereby the target 55 can be completed.

Although an illustrative embodiment of this invention has been described in detail herein with reference to the accompanying drawings, it is to be understood that the invention is not limited to that precise embodiments, and that various changes and modifications may be effected therein by one skilled in the art without departing from the scope or spirit of this invention, as defined in the appended claims. The openings 40 of the metal electrode 41 may be circular, hexagonal or the like to change a storage condition of signal and the pitch of the openings 40 may be made smaller to get a higher image dissection. The semiconductor substrates 39 and 59 may be made of another semiconductor such as Ge and the conductivity type may be converted. The electron guns 3 and 4 can be arranged on the same side against the target 35. In this case, the thickness of the semiconductor substrate 39 may be more than 100 $\mu$m, so that pairs of electron-hole are generated in depletion layers or in the neighborhood of it. Moreover, the reading operation corresponding to the section C shown on FIG. 7A can be omitted and the written signal can be read out by the preparatory operation corresponding to the section B. In this case, the surface potential of the insulating layer with the written signal becomes equal to the target potential $V_3$ and the surface potential of the insulating layer without the written signal becomes equal to the potential $V_o$ of the cathode. Accordingly, the electron beams for reading the written signal land on the surface of the insulating layer with the written signal to emit secondary electrons by the incidence quantity of the electron beams, which are collected in the metal electrode 41. On the other hand, other secondary electrons can be collected in the metal electrode 41 because the electron beams are repelled by the surface of the insulating layer without the written signal. Thus, the output signal can be selectively taken out through the metal electrode 41.

In this invention, a signal can be written in the target 35 by the use of light or photo-electrons generated by light excitation instead of the use of the electron beam from the electron gun 3. When light is used for writing the signal, namely when this invention is applied to an image pickup type charge storage tube, a photographic image can be stored very well according to this invention because the written photographic image is not destroyed and is stored for a long time.

What is claimed is:

1. A charge storage tube comprising a target, means for writing a signal in said target by generating pairs of electron-holes within said target and means for reading out said signal by scanning electron beams on said target, wherein said target comprises a semiconductor substrate with a specific resistance greater than 1 ohm/cm, an insulating layer formed on said semiconductor substrate and a metal electrode with openings formed on said insulating layer, hetero junction diodes being formed between said insulating layer and said semiconductor substrate, means for changing the target potential of said target above and below a first crossover potential of an accelerating potential of said electron beams.

2. A charge storage tube according to claim 1, wherein said means for writing said signal is electron beams.

3. A charge storage tube according to claim 1, said means for writing said signal and said means for reading said signal are arranged on opposite sides of said target.

4. A charge storage tube according to claim 1, wherein said insulating layer is made of $SiO_2$, $Al_2O_3$ or $CaF_2$.

5. A charge storage tube according to claim 1, wherein said openings of said metal electrode is circular, triangular or polygon.

6. A charge storage tube according to claim 1, wherein a high doped region to prevent said pairs of electron-hole from recombining is formed on the opposite side of said semiconductor substrate against said insulating layer.

7. A charge storage tube according to claim 1, wherein P-type semiconductive regions are formed in an N-type semiconductor substrate under said openings of said metal electrode.

8. A charge storage tube according to claim 1, said means for writing said signal and said means for reading said signal are arranged on the same side of said target.

9. A method for operating a charge storage tube according to claim 1, comprising the steps of writing said signal in said target such that said target potential is set up below said first cross-over potential to writing electron beams, raising said target potential over said first cross-over potential to set up the surface potential of said insulating layer on which said signal has been written over said first cross-over potential and to set up the surface potential of said insulating layer on which said signal has not been written below said first cross-over potential, and scanning said electron beams on said target to read out said written signal.

10. A method for operating a charge storage tube according to claim 9, wherein said signal comprises electron beams.

11. A method for operating a charge storage tube according to claim 9, wherein said target potential is decreased below said first cross-over potential before scanning said electron beams for reading out said written signal, so that said surface potential of said insulating layer with said written signal is decreased to the value between said first cross-over potential and the potential of said electron beams for reading out said written signal, while said surface potential of said insulating layer with no written signal is decreased below the potential of said electron beams for reading out said written signal.

* * * * *